(12) United States Patent
Alladio et al.

(10) Patent No.: US 7,994,808 B2
(45) Date of Patent: Aug. 9, 2011

(54) CONTACT INSERT FOR A MICROCIRCUIT TEST SOCKET

(75) Inventors: Patrick J. Alladio, Santa Rosa, CA (US); Brian K. Warwick, Ben Lomond, CA (US)

(73) Assignee: Johnstech International Corporation, Minneapolis, MN (US)

( * ) Notice: Subject to any disclaimer, the term of this patent is extended or adjusted under 35 U.S.C. 154(b) by 131 days.

(21) Appl. No.: 12/024,622

(22) Filed: Feb. 1, 2008

(65) Prior Publication Data

US 2008/0218177 A1    Sep. 11, 2008

Related U.S. Application Data

(60) Provisional application No. 60/887,983, filed on Feb. 2, 2007.

(51) Int. Cl.
*G01R 31/02* (2006.01)

(52) U.S. Cl. ................................ 324/756.01; 324/756.07

(58) Field of Classification Search ............... 324/158.1, 324/754–765
See application file for complete search history.

(56) References Cited

U.S. PATENT DOCUMENTS

| | | | |
|---|---|---|---|
| 5,172,049 A * | 12/1992 | Kiyokawa et al. | 324/760 |
| 5,926,027 A * | 7/1999 | Bumb et al. | 324/755 |
| 6,437,585 B1 | 8/2002 | Mickey, III et al. | |
| 6,861,667 B2 * | 3/2005 | Gilk et al. | 257/48 |
| 7,053,640 B2 * | 5/2006 | Feld et al. | 324/755 |
| 7,699,616 B2 * | 4/2010 | Miller et al. | 439/45 |
| 7,867,031 B2 * | 1/2011 | Amleshi et al. | 439/607.08 |
| 2004/0106310 A1 | 6/2004 | Gilk et al. | |
| 2008/0297142 A1 * | 12/2008 | Alladio et al. | 324/158.1 |

* cited by examiner

*Primary Examiner* — Ha Tran T Nguyen
*Assistant Examiner* — Joshua Benitez
(74) *Attorney, Agent, or Firm* — Nawrocki, Rooney & Silvertson, P.A.

(57) ABSTRACT

A system for testing a microcircuit having a center ground (CG) terminal has an insert for electrically connecting the CG terminal to a ground contact on a load board. The insert is held within a housing by compression and frictional interaction between a resilient projection carried by the insert and a slot in a wall of an aperture holding the insert.

16 Claims, 2 Drawing Sheets

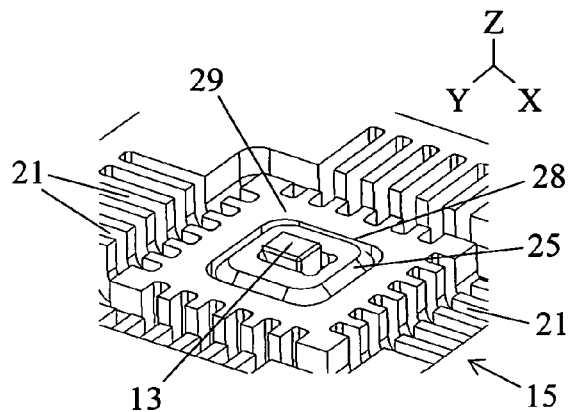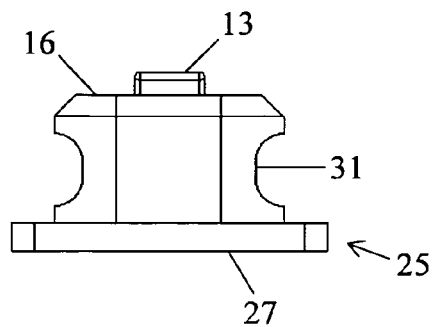
Fig. 1A    Fig. 1B
PRIOR ART
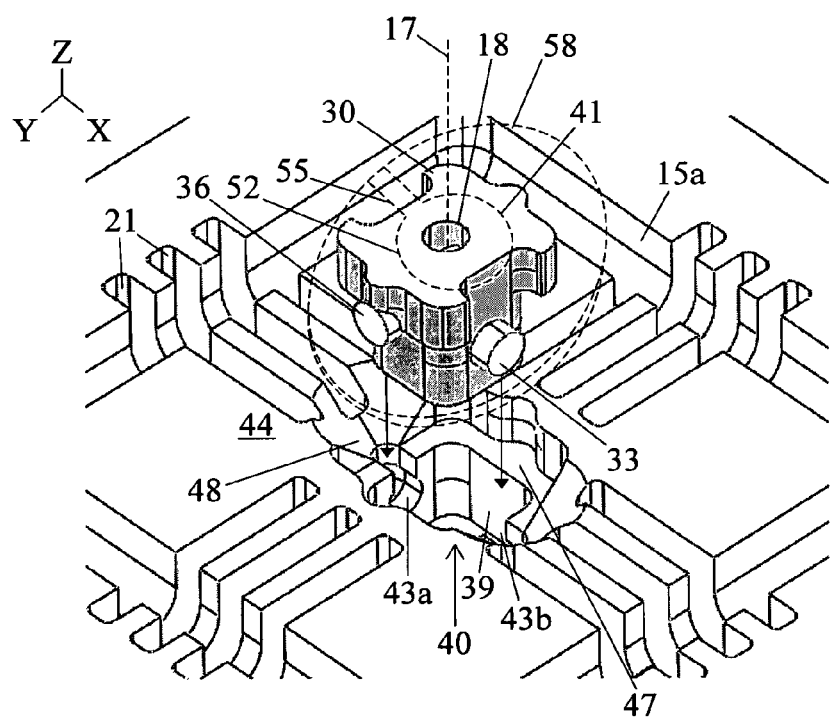
Fig. 2

CONTACT INSERT FOR A MICROCIRCUIT TEST SOCKET

CROSS-REFERENCE TO RELATED APPLICATIONS

This is a regular application filed under 35 U.S.C. §111(a) claiming priority, under 35 U.S.C. §119(e)(1), of provisional application Ser. No. 60/887,983, previously filed Feb. 2, 2007 under 35 U.S.C. §111(b).

BACKGROUND OF THE INVENTION

The invention pertains to improvements to equipment for testing microcircuits. The manufacturing processes for microcircuits cannot guarantee that every microcircuit is fully functional. Dimensions of individual microcircuits are microscopic and process steps very complex, so small or subtle failures in a manufacturing process can often result in defective devices. For this reason, microcircuit testing has become widely practiced, in both the semiconductor manufacturing and the circuit board assembly industries.

While the cost of a microcircuit is frequently quite small, mounting one on a circuit board adds substantial value due to the cost of the circuit board and the manufacturing cost itself. Installation usually involves soldering the microcircuit onto the circuit board, and is not usually reversible. Once mounted on a circuit board, removing a microcircuit often ruins the circuit board. Thus, if the microcircuit is defective, the circuit board itself is probably ruined as well, meaning that the entire value of the circuit board at that point is lost.

For all these reasons, a microcircuit is usually tested before installation on a circuit board. Each microcircuit must be tested in a way that identifies nearly all defective devices, but only rarely identifies good devices as defective. Either kind of error adds cost to the overall manufacturing process.

Microcircuit test equipment itself is quite complex. First of all, the test equipment must make accurate, low resistance, temporary duty, non-destructive, contact with every one of the small, closely spaced microcircuit terminals. Because of the small size of microcircuit terminals and the small spacing between adjacent pairs, even small alignment errors between the test equipment contacts and microcircuit terminal pads will result in incorrect connections. Connections to the microcircuit that are misaligned or otherwise incorrect will cause the test equipment to identify the microcircuit, that is, the device under test (DUT), as defective, even though the reason for the failure is the defective connections rather than defects in the DUT itself.

A further problem in microcircuit test equipment arises in automated testing, where a single system may test 100 or more DUTs a minute. The sheer number of tests can cause wear on the test equipment contacts as the DUT terminals mate with the test equipment contacts and wipe against them. This wiping often removes particles from the DUT terminals. The particles can then build up on the test equipment contacts. The DUT packages may also transport contaminants such as oils or mold release materials derived from DUT fabrication processes, to the test equipment contacts and other components of the test equipment.

The particles and other contaminants may eventually build to a point where they interfere with the electrical connections between the DUT terminals and the test equipment contacts during testing, which may result in false indications that the DUT is defective. The particles may also create leakage paths between adjacent test equipment contacts, also leading to false indications that the DUT is defective.

One particular type of microcircuit often tested before installation has a relatively large, centrally located ground (CG) terminal on a flat, bottom surface of the microcircuit package. The microcircuit signal and power (S&P) terminals surround the CG terminal in a predetermined array. Microcircuit packages having this configuration of terminals may be called CG packages.

FIGS. 1A and 1B show the current state of the art for a housing 15 and related structure that collectively form a part of a test system for DUTs configured as CG packages. In a complete test system, housing 15 fits between an alignment plate and a load board (neither shown in FIGS. 1A and 1B). Housing 15 is made from an insulating material. This configuration of alignment plate, load board, and housing 15 is well known in microcircuit testing technology.

A complete test system includes an alignment plate having an aperture whose walls precisely position the DUT in the X and Y axes directions relative to test contacts (not shown) that are held in an array of slots 21. The alignment plate aperture forms the walls of a test well or cavity in which the DUT is placed by a loader or handler during a test procedure. Typically, the array of slots 21 comprises four quadrants, one of each of which is positioned adjacent to one of the four walls or edges of the alignment plate aperture along the Z axis.

Housing 15 has in a surface 29, an aperture 28 for receiving a CG terminal insert 25 shown in FIG. 1B. Insert 25 has a CG test contact 13 that projects from and is centrally located in the top surface 16 of insert 25. Test contact 13 makes electrical connection with the body of insert 25. Test contact 13 is mounted in insert 25 with resilience along the Z axis relative to insert 25. Retention projections extend from the walls of aperture 28 and resiliently deflect slightly during installation of insert 25. After installation, these projections project into recesses 31 of insert 25 to retain insert 25 within aperture 28. The projections do not restrict insert 25 from shifting slightly along the Z axis after installation.

The surface 29 of housing 15 and an upper surface 16 of insert 25 form the floor or bottom on which the DUT rests. Surface 16 projects slightly above the plane of surface 29. Surface 16 has a footprint that puts it within all of the S&P terminals on the DUT surrounding the CG terminal on the DUT surface with the CG terminal. This provides clearance for access to the S&P terminals.

The top end of test contact 13 when not deflected in the Z axis direction, projects slightly above surface 16 of insert 25 as seen in FIG. 1b. The bottom end 27 of insert 25 mechanically rests on and is supported in the Z axis direction by a surface of the load board having an electrical contact for insert 25. In this way, the CG terminal of the DUT is electrically connected to the load board. In this configuration of housing 15 and insert 25, insert 25 is pressed against the load board only when the loader is pressing a DUT against test contact 13 and surface 16.

Slots 21 of housing 15 hold S&P test contacts that project from slots 21 toward surface 29. The center to center spacing of each slot 21 aligns each S&P test contact with its associated S&P terminal on a DUT to allow the S&P test contact to make good electrical contact with its associated S&P terminal for testing. As with CG test contact 13, each S&P test contact is designed to resiliently deflect in the Z axis direction.

To begin a test, a loader moves the DUT into a prescribed position for testing (test position). In the test position, the DUT's CG terminal presses against test contact 13, the S&P terminals of the DUT press against the S&P test contacts, and the surface of the DUT's CG terminal surrounding contact 13 presses on surface 16. In the test position, all of the S&P test contacts are slightly deflected in the Z axis direction by force the respective DUT terminals apply. This force on the individual test contacts from their respective DUT terminals provides assurance that all of the S&P contacts make good electrical contact with the DUT terminals. This arrangement makes consistent contact force between each DUT S&P terminal and the associated test contact likely, and prevents damage to either.

In the test position, the load board holds insert 25 in a Z axis position that provides a hard stop for the DUT Z axis position and prevents overtravel of the DUT. This arrangement provides assurance that the Z axis position of each DUT is nearly identical as each is tested. The force of the CG terminal against test contact 13 is controlled by the resiliency of the mounting of contact 13 in insert 25 and is designed to provide proper contact pressure (force per unit area) and wiping between insert 13 and the DUT CG terminal during testing.

In current test equipment designs, the mounting of insert 25 does not strongly force insert 25 into contact with the load board when a DUT is not in the test position. As the DUT moves into the test position and is pressed against insert 25, the loader's pressure on the DUT often shifts insert 25 along each of the X, Y, and Z axes a very small amount within aperture 28 and on the load board.

This shifting when repeated for many thousands of DUT insertions, can create significant wear on the insert 25, the housing 15, and the load board pad in contact with insert 25. The effect of this wear is to require replacement of these components, during which time the test equipment cannot be used. The wear also creates debris that as explained above, may interfere with the testing process.

BRIEF DESCRIPTION OF THE INVENTION

A system for testing a microcircuit having a center ground (CG) terminal includes a load board having a ground terminal thereon on a first side. A housing mounted on the load board's first side carries test terminals arranged around an area on a first surface of the housing for receiving the microcircuit. The housing further includes an aperture open from the housing's first surface to the load board ground terminal.

In use, a microcircuit to undergo testing mounts on the housing's first surface with its CG terminal aligned with the aperture. The aperture has for ease of reference, a Z axis perpendicular to the load board's first side.

The aperture holds a conductive ground connector insert having a CG terminal end projecting from the aperture adjacent to the first side of the housing for contacting the microcircuit CG terminal. The insert also has a load board contact end projecting from the aperture adjacent to the load board for contacting the load board ground terminal. The actual invention comprises in the insert, a first projection from the side thereof and substantially perpendicular to the Z axis. The invention also comprises in a wall defining the aperture, a slot for receiving the first projection to retain the insert in a predetermined Z axis position within the aperture.

In a preferred embodiment, the projection has a predetermined dimension parallel to the load board first side. The slot has a predetermined cooperating dimension in Z axis alignment with the projection's predetermined dimension. Predetermined dimensions of the slot and the projection allow the slot and the projection to cooperate to form a detent retaining the insert within the aperture.

For example, the detent function may arise by providing a slot having a predetermined dimension that is smaller than a predetermined dimension of a projection from the insert and that is formed of a resilient material. Installing the insert in the aperture causes the resilient projection to enter and to distort while entering the slot. The resiliency of the projection causes the projection to expand within and fill the slot. This creates a retaining force in the nature of a detent between the projection itself and the slot walls holding the insert in the aperture.

This design lends itself to a further improvement that provides biasing force that presses the insert's load board CG contact end firmly against the load board ground terminal to limit migration of debris into the interface between the insert and the load board ground terminal.

This improvement includes in the aperture, a shelf facing away from the load board. The insert includes a resilient second projection extending transversely to the Z axis and in Z axis alignment with the shelf. The Z axis locations of the shelf and the second projection cause elastic deflection or distortion of the second projection when the insert is in the predetermined Z axis position. This deflection or distortion creates the force that presses the insert's load board contact end firmly against the load board ground contact.

BRIEF DESCRIPTION OF THE DRAWINGS

FIG. 1A is a top perspective view of a prior art insert and housing. FIG. 1B shows a side elevation view of the prior art insert.

FIG. 2 is an exploded perspective view of the load board side of a housing and the ground insert of the invention, with a portion of a load board shown in phantom.

DESCRIPTION OF THE EMBODIMENT

Figure 3A:
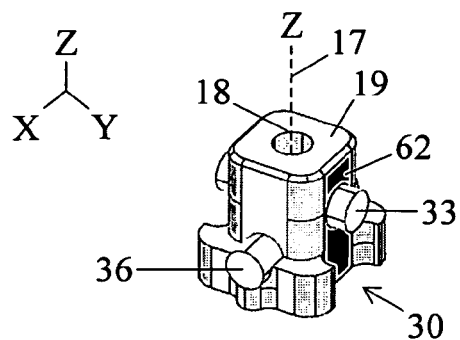
FIGS. 3A and 3B show perspective views of the insert of the invention with CG terminal and load board contact ends respectively, visible to the viewer.

The FIG. 2 perspective view shows a modified housing 15a from the load board side, i.e. bottom facing up, with an insert 30 aligned for inserting in an aperture 40 in housing 15a. Walls 39 define aperture 40 and are substantially parallel with a Z axis 17 of aperture 40.

Portions of housing 15a surrounding aperture 40 have slots 21 for retaining and aligning test contacts (not shown) that make electrical contact with the S & P terminals of the DUT. Aperture 40 passes completely through housing 15a from surface 44 on the load board side to the DUT mounting side. Housing 15a has a bevel 48 surrounding aperture 40 that facilitates the process of installing an insert 30 into aperture 40. Surface 44 is substantially coplanar with the upwardly-facing surfaces between individual slots 21.

FIG. 2 shows a portion of a load board 58 in phantom with a first side facing insert 30 (and facing away from the viewer as shown in FIG. 2). The load board 58 first side is flat and when assembled to housing 15a, is substantially perpendicular to Z axis 17. The load board first side carries a ground terminal 52 in facing relation to insert 30. A conductor path 55 on the load board 58 first side is shown leading from ground terminal 52. When housing 15a is attached to load board 58, surface 44 is essentially resting on the first side of load board 58.

Aperture 40 is a modification of aperture 28 shown in FIG. 1A, and insert 30 is a modification of the prior art insert 25 shown in FIG. 1B. Electrically, insert 30 improves upon the functionality of insert 25, as will be described. The modified aperture 40 cooperates with features of modified insert 30 to accept and retain insert 30 and to bias insert 30 into constant pressure against the ground terminal 52 of load board 58.

Aperture 40 includes in the walls 39 thereof, a pair of identical, opposed, inward and downwardly facing, keyhole-shaped slots or recesses 43a and 43b. ("Downward" because FIG. 2 shows housing 15a from the load board 58, i.e., bottom side.) Identical slots 43a and 43b are shaped and positioned in Z axis alignment to receive identical resilient projections 33 on opposite sides of insert 30. (In FIG. 2, the near keyhole slot 43b is only partially visible, and the projection 33 facing away from the viewer is not visible.) Projections 33 are preferably elastomeric. The internal surfaces of slots 43a and 43b facing each other along the X axis are substantially spherical segments.

The slots 43a and 43b narrow at the ends nearer to surface 44 and the first side of load board 58. When insert 30 is pressed into aperture 40, projections 33 deform when passing though these narrowed ends and then expand when reaching the larger bottoms of slots 43a and 43b. Projections 33 and slots 43a and 43b cooperate to form a detent that retains insert 30 within aperture 40. Thus, when attaching housing 15a to load board 58, each of perhaps many inserts 30 is retained in housing 15a. At the same time, it is easy to force an individual insert 30 from aperture 40.

Figure 3B:
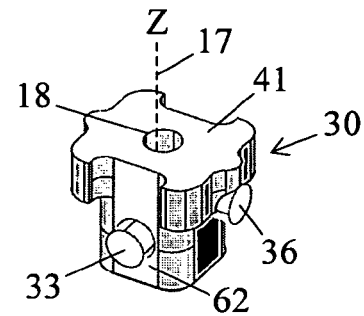

FIG. 3A shows the modified insert 30 with CG contact surface 19 visible. FIG. 3B shows insert 30 with the load board contact surface 41 showing, and rotated 90° about the Z axis 17 relative to the view of FIG. 3B. X and Y axes are orthogonal to each other and Z axis 17. This mounting of insert 30 also resists shifting of insert 30 on the load board, which prevents debris migration into the space between contact surface 41 and the load board after testing many DUTs. Unlike insert 25 in FIGS. 1A and 1B, insert 30 has no inherent compliance relative to the load board, and serves only as a hard stop to limit DUT position along the Z axis. The loader that mounts a DUT for testing provides compliance for Z axis positioning of the DUT to firmly press the DUT against insert 30.

According to known principles, a preferred insert 30 has a first bore 18 extending from load board contact surface 41 through insert 30 to test contact surface 19. The smooth wall of bore 18 improves conduction between load board contact surface 41 and test contact surface 19. Conduction is further improved by furnishing insert 30 with smooth side walls from load board contact surface 41 to test contact surface 19.

One problem with an insert having a bore such as bore 18 is that debris generated during production DUT testing by contact between test contact surface 19 and the many CG terminals of individual DUTs, can migrate through bore 18 to the interface between load board contact surface 41 and ground terminal 52. This debris may interfere with good electrical contact between ground terminal 52 and contact surface 41 and may cause wear on ground terminal 52.

In a preferred embodiment, projections 33 comprise a resilient cylinder that interferingly fits into a second bore that is substantially transverse to Z axis 17 and to first bore 18. This resilient cylinder projects from the second bore to form projections 33. The second bore intersects the first bore 18. The resilient cylinder within the second bore and forming projections 33, completely closes first bore 18 preventing debris migration to load board contact surface 41 through bore 18 from test contact surface 19, reducing ground terminal 52 wear and improving electrical contact between ground terminal 52 and contact surface 41.

In addition, aperture 40 has a pair of shelves 47 facing generally toward the load board side of housing 15a. Shelves 47 oppose each other across aperture 40, and may extend to intersect the sides of aperture 40 containing the slots 43a and 43b. (One shelf 47, nearer to the viewer, is not visible in FIG. 2.)

Biasing projections 36 protrude from sides of insert 30 that are orthogonal to the sides that carry projections 33. Preferably, projections 36 comprise a resilient cylinder, usually comprising an elastomer, that fits in a third bore in insert 30. This third bore is preferably orthogonal to both Z axis 17 and the second bore holding the cylinder forming the retention projections 33.

When insert 30 is mounted in aperture 40 and housing 15a is properly attached to load board 58, then pressure of shelves 47 against projections 36 distorts projections 36. The distorted projections 36 create force that resiliently biases insert 30 against load board 58. This bias force limits debris from penetrating the interface between ground terminal 52 and contact surface 41

The insert 30 is installed into the aperture 40 from the load board side, before mounting housing 15a on the load board. A probe or tool is used to force projections 33 into slots 43a and 43. Projections 33 deform during this installation process. Projections 33 should fit tightly in slots 43a and 43b to securely retain insert 30 in aperture 40.

Figure 4:
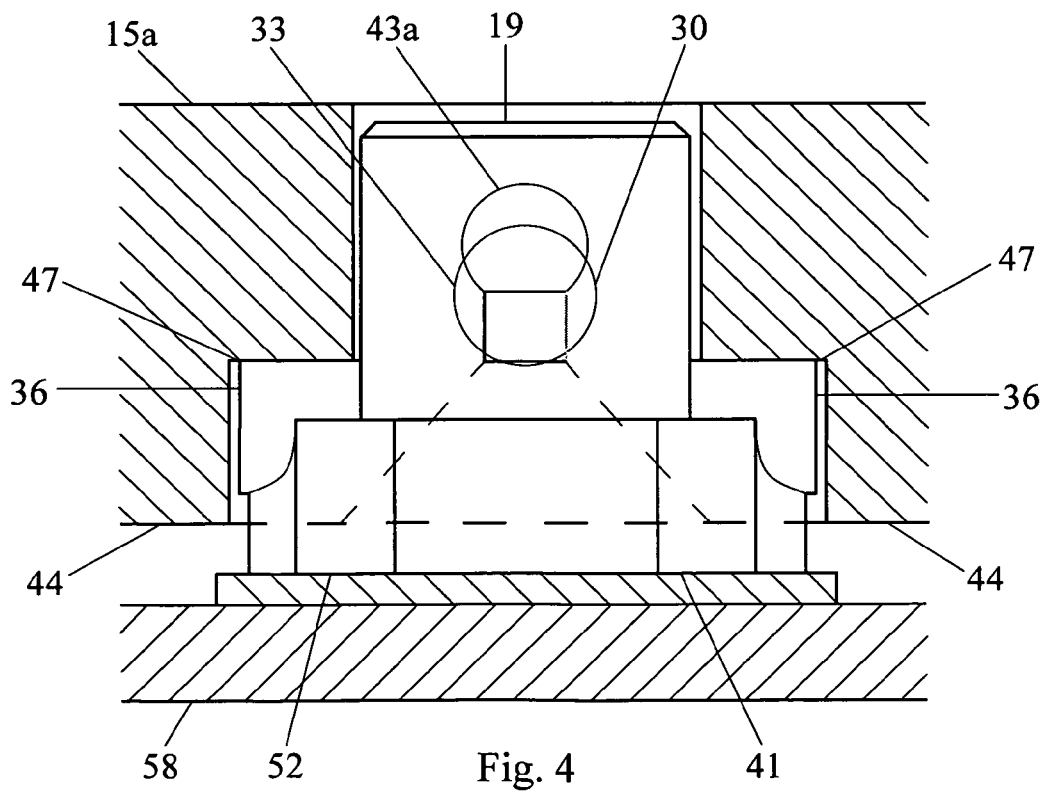
FIG. 4 is a side elevation section view of the insert of the invention, the housing for supporting the insert, and the load board.

FIG. 4 shows a side view of housing 15a before attaching to the load board 58, as suggested by the fact that CG contact surface 19 is not projecting above the adjacent surface of housing 15a. Insert 30 is shown mounted in aperture 40 with an elastomeric projection 33 facing toward the viewer. Surface 41 of insert 30 is projecting past surface 44 of housing 15a. In this state, shelves 47 lightly contact projections 36 with projections 33 pressed into slots 43a and 43b.

Mounting housing 15a onto load board 58 presses the load board ground terminal 52 against the adjacent contact surface 41, forcing insert 30 more deeply into aperture 40 so that contact surface 41 is close to coplanar alignment with surface 44 of load board 58 itself. This shifting of insert 30 causes shelves 47 to elastically distort projections 36. The elastic distortion of projections 36 causes insert 30 to press with substantial force against ground terminal 52 on load board 58. Thus, projections 36 causes continual mechanical loading on and electrical contact between surface 41 of insert 30 and ground terminal 52.

After completing installation of each insert 30 and mounting housing 15a on load board 58, and with housing surface 44 pressing against load board 58, CG contact surface 19 projects above the adjacent surface of housing 15a. Also, after completing installation, insert 30 still projects slightly from aperture 40 so that surface 41 is essentially coplanar with surface 44 adjacent to aperture 40. The FIG. 4 view shows housing 15a spaced slightly from load board 58, just before mounting housing 15a on load board 58.

The dimensions of insert 30 and projections 36; the relative positions of projections 36 and 33 on insert 30; and the relative positions of shelves 47 and slots 43a and 43b all cooperate so that the step of mounting housing 15a on the load board causes the load board ground terminal 52 to shift insert 30 along the Z axis toward the DUT test position and simultaneously deflect or distort elastomeric projections 36.

The use of resilient members 33 to retain insert 30 in housing 15a and resilient members 36 to press insert 30 against the load board provides advantages over a mounting that uses rigid components. Where rigid components are used, the inevitable shifting of these components with respect to each other results in wear that produces debris and often, retention failure for insert 30.

This deflection or distortion of the elastomeric projections 36 causes the resilience in projections 36 to preload insert 30 against the load board. The preload pressure or force of insert 30 against the load board prevents much of the scrubbing and wear between insert 30 and the load board as DUTs arrive at and leave the test position.

A force in the range of approximately 100 -135 grams between load board 58 and an individual insert 30 having a surface 41 area on the load board 58 in the range of 1-2 mm² seems to reduce or even prevent most scrubbing and wear between the load board 58 and an insert 30, and to prevent migration of debris into the space between the ground terminal 52 and the contact surface 41 on insert 30. The pressure should in any case be adequate to hold an insert 30 firmly against the load board during all phases of DUT testing. The elastic modulus and size of projections 36 should be chosen to provide the desired loading of surface 41 on ground terminal 52. Note that sometimes several of these inserts are provided in a single housing 15a. The total force required to force the housing 15a into the proper location on a load board 58 is the sum of all the forces for all of the inserts 30.

In the current embodiment, insert 30 is rigid with no inherent compliance in the Z axis responsive to force applied by a DUT held in the test position by the loader. Insert 30 provides a hard stop function to prevent overtravel by the DUT while the loader moves the DUT into and holds the DUT in the test position. Overtravel by the DUT along the Z axis is undesirable because it may cause permanent distortion of the test equipment contacts or the load board. The loader structure instead preferably provides the correct hard stop test state height between the DUT and insert 30.

The force produced by projections 36 to press insert 30 against the load board is a function of the size of projections 36, the spacing between shelves 47 and insert 30, and the material from which projections 36 is made. To create force between the load board 58 and insert 30 within the desired range, the following parameters prior to mounting housing 15a on the load board are representative:
diameter of elastomeric projections 36: 0.406 mm (0.016")
length of elastomeric projections 36: 1.75 mm (0.069")
nominal spacing between shelves 47 and insert 30: 0.152 mm (0.006")
nominal deflection of projections 36 when housing 15a is mounted on the load board: 0.152 mm (0.006")
material durometer reading for projections 33 and 36: elastomer with a Shore A hardness scale of 70D±5D Projection of insert 30 past surface 44 before mounting housing 15a on the load board: 0.152 mm (0.006")

The dimensions and location of slots 43a and 43b and projections 33 when insert 30 is installed within aperture 40 are also important to properly retain insert 30. Mounting housing 15a on the load board 58 displaces insert 30 along Z axis 17. The design builds in an amount of Z axis offset for projections 33 from the bottoms of slots 43a and 43b, as shown in FIG. 4 before the load board applies force to insert 30.

The following dimensions seem to provide for effectively retaining insert 30 on the one hand, and to allow for reasonably easy insertion and removal on the other. Because this design has a great many interrelated dimensions, many other sets of values are equally acceptable.
diameter of elastomeric projections 33: 0.406 mm (0.016")
narrowest width of slots 43a and 43b: 0.254 mm (0.01")
diameter of spherical surfaces in bottom ends of slots 43a and 43b: 0.381 mm (0.015")
maximum depth (x axis dimension) of slots 43a and 43b: 0.393 mm (0.0155")
nominal distance each projection 33 extends into slots 43a and 43b: 0.220 mm (0.0087")

What is claimed is:

1. A system for electrically connecting to a microcircuit having a center ground (CG) terminal for the purpose of testing the microcircuit, said system including a load board having a ground terminal thereon on a first side; a housing mounted on the load board first side for carrying test terminals arranged around a first surface area of the housing for receiving the microcircuit, and an aperture open from the housing first surface area to the load board ground terminal and for aligning with the CG terminal of a microcircuit on the housing first surface, said aperture having a Z axis perpendicular to the load board first side, said housing having a conductive ground connector insert within the aperture and having a CG terminal end for contacting the microcircuit CG terminal and a load board contact end for contacting the load board ground terminal, wherein the insert includes a side and a first resilient projection on that side extending substantially perpendicular to the Z axis, and wherein the housing includes a wall defining at least a part of the aperture, said wall having a wall feature for cooperating with the first projection to provide for at least one of a) retaining the insert within a predetermined Z axis position within the aperture, and b) mechanically biasing the insert against the load board ground terminal.

2. The system of claim 1 adapted for retaining the insert within the aperture, wherein the wall feature comprises a slot having an axis substantially parallel with the Z axis and wherein the slot is open at the end thereof spaced from the load board, and wherein the first projection engages the slot.

3. The system of claim 2, wherein the first projection has a predetermined dimension parallel to the load board first side, and wherein the slot has a predetermined cooperating dimension in Z axis alignment with the predetermined dimension of the first projection and forming with the predetermined dimension of the first projection, a detent retaining the insert within the aperture.

4. The system of claim 3, wherein the slot's predetermined dimension is smaller than the predetermined dimension of the first projection.

5. The system of claim 4, wherein the insert has a first bore extending from the load board contact end toward the CG terminal end, and a second bore substantially transverse to the Z axis and intersecting the first bore, wherein the second bore contains a first resilient cylinder projecting from the second bore and forming the first projection, said resilient cylinder closing the first bore at the intersection of the first and second bores.

6. The system of claim 5, wherein the wall feature of the aperture includes a shelf oriented to face toward the load board contact end of the insert, and wherein the insert includes a resilient second projection extending transversely to the Z axis and in Z axis alignment with the shelf, wherein the Z axis locations of the shelf and the second projection cause deflection of the second projection when the insert is in the predetermined Z axis position.

7. The system of claim 6, wherein the insert has a third bore substantially transverse to the Z axis, and a resilient cylinder within the third bore and projecting therefrom to form the second projection.

8. The system of claim 7, wherein the second and third bores are orthogonal and spaced from each other along the Z axis.

9. The system of claim 3, wherein the wall feature of the aperture includes a shelf facing away from the load board, and wherein the insert includes a resilient second projection extending transversely to the Z axis and in Z axis alignment with the shelf, wherein the Z axis locations of the shelf and the second projection cause deflection of the second projection when the insert is in the predetermined Z axis position.

10. The system of claim 1 adapted for mechanically biasing the insert against the load board ground terminal, wherein the wall feature comprises a shelf facing the load board, and wherein the resilient first projection extends transversely to the Z axis and into Z axis alignment with the shelf, wherein the relative Z axis locations of the shelf and the first projection cause the shelf to deflect the first projection when the insert is in a predetermined Z axis position, to thereby mechanically bias the insert toward the load board ground terminal.

11. The system of claim 10, wherein the insert has a bore substantially transverse to the Z axis, and within and projecting from the transverse bore, a resilient cylinder, said resilient cylinder having an end, the end of said resilient cylinder forming at least a part of the projection.

12. The system of claim 11, wherein the insert has a longitudinal bore extending from the load board contact end toward the CG terminal end and intersecting the transverse bore, and the resilient cylinder intersects with and closes the longitudinal bore at the intersection of the longitudinal and transverse bores.

13. The system of claim 12, wherein the transverse bore extends from one side of the insert through the insert to an opposite side thereof, and the resilient cylinder projects from the insert on the opposite sides thereof.

14. The system of claim 13, wherein the shelf is substantially perpendicular to the Z axis.

15. The system of claim 11, wherein the transverse bore extends from one side of the insert through the insert to an opposite side thereof, and the resilient cylinder projects from the insert on opposite sides thereof.

16. The system of claim 15, wherein the shelf is substantially perpendicular to the Z axis.

* * * * *